(12) United States Patent
Nagira et al.

(10) Patent No.: US 7,550,304 B2
(45) Date of Patent: Jun. 23, 2009

(54) METHOD FOR MANUFACTURING SEMICONDUCTOR LASER ELEMENT

(75) Inventors: Takashi Nagira, Tokyo (JP); Chikara Watatani, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 31 days.

(21) Appl. No.: 11/624,722

(22) Filed: Jan. 19, 2007

(65) Prior Publication Data

US 2008/0050850 A1  Feb. 28, 2008

(30) Foreign Application Priority Data

Aug. 28, 2006  (JP) .............................. 2006-230856

(51) Int. Cl.
*H01L 21/00* (2006.01)
(52) U.S. Cl. .................... 438/22; 438/27; 257/E33.023
(58) Field of Classification Search .................. 438/22, 438/39, 46, 47, 27
See application file for complete search history.

(56) References Cited

U.S. PATENT DOCUMENTS

| | | | | |
|---|---|---|---|---|
| 4,468,850 | A * | 9/1984 | Liau et al. ..................... | 438/39 |
| 5,948,161 | A | 9/1999 | Kizuki | |
| 6,821,801 | B1 | 11/2004 | Sato et al. | |
| 2003/0219918 | A1 * | 11/2003 | Shinohara et al. ............. | 438/22 |
| 2007/0155031 | A1 * | 7/2007 | Yamazaki et al. ............. | 438/22 |

FOREIGN PATENT DOCUMENTS

| | | |
|---|---|---|
| JP | 1-214017 | 8/1989 |
| JP | 4-72687 | 3/1992 |
| JP | 6-232099 | 8/1994 |
| JP | 7-263355 | 10/1995 |
| JP | 10-335756 | 12/1998 |
| JP | 2005-150181 A | 6/2005 |
| UA | 2 271 466 | 4/1994 |

OTHER PUBLICATIONS

Kizuki, H. et al.; "Reduction of interface contamination in regrown GaAs on AlGaAs using a novel two-step HCl gas etching process", *J. of Crystal Growth* 146, (1995) pp. 527-532.

Shu Gotoh and Hideki Horikawa; "Characteristics of AlGaAs/AlGaAs Interface Regrown Using In-Situ Low-temperature $h_2$ Annealing in Metalorganic Vapor Phase Epitaxy", *Jpn. J. Appl. Phys.*, vol. 36, (1997) pp. 1741-1745, Part 1, No. 3B, Mar. 1997.

Kondo, N., et al.; "Hydrogen ECR plasma surface cleaning using AlGaAs substrates", *Inst. Phys. Conf.*, Ser. No. 129: Chapter 7 pp. 585,590, Paper presented at Int. Symp. GaAs and Related Compounds, Karuizawa, 1992.

* cited by examiner

*Primary Examiner*—Phat X Cao
*Assistant Examiner*—Nga Doan
(74) *Attorney, Agent, or Firm*—Leydig, Voit & Mayer, Ltd.

(57) ABSTRACT

A method for manufacturing a semiconductor laser element includes forming a semiconductor laminated structure, having an active layer, on a substrate; etching the semiconductor laminated structure to form a mesa; exposing the mesa to an oxygen-containing ambient forming an oxide layer on the mesa; removing a first part of the oxide layer from the mesa at a temperature lower than a critical temperature at which bonds between atoms of the oxide layer become stronger, by etching with a gas; removing the remainder of the oxide layer from the mesa at a temperature higher than the critical temperature by etching with a gas; and forming a burying layer coating the mesa.

2 Claims, 6 Drawing Sheets

METHOD FOR MANUFACTURING SEMICONDUCTOR LASER ELEMENT

BACKGROUND OF THE INVENTION

1. Field of the Invention

The present invention relates to a method for manufacturing a semiconductor laser element wherein a semiconductor laminated structure having an active layer is etched to form a mesa, and the circumference of the mesa is buried with a burying layer.

2. Background Art

In a semiconductor laser element, the current pathway must be narrowed to efficiently supply a current to the active layer. Therefore, in many semiconductor lasers, after fabricating a semiconductor laminated structure having an active layer, a mesa is formed using a technique to transfer micropatterns to an inductive film and an etching technique to limit the region where a current flows, and to narrow the current pathway. At this time, from the standpoint of the protection of the active layer exposed on the side of the mesa, heat dissipation, or the parasitic capacity of the element, a buried structure wherein the circumference of the mesa is coated with semiconductors is formed.

FIG. 11 is a sectional view showing a semiconductor laser element wherein the circumference of the mesa in a semiconductor laminated structure having an active layer is buried with n/p/n/p-type semiconductor layers. A mesa of a semiconductor laminated structure wherein a p-type InP clad layer 12, an AlGaInAs lower optical confinement layer 13, an AlGaInAs-MQW active layer 14, an n-type AlGaInAs upper optical confinement layer 15, and an n-type InP clad layer 16 are sequentially grown on a p-type InP substrate 11, is formed. The circumference of the mesa is buried with p-type InP burying layers 17a and 17b, an n-type InP current blocking layer 18, a p-type InP burying layer 19, and an n-type InP burying layer 20. Thereon, an n-type InP contact layer 21, an n-type InGaAs contact layer 22, and an n-type InP cap layer 23 are formed.

Here, the side of the mesa must be coated with the p-type InP burying layer 17a. This is because if the n-type InP current blocking layer 18 contacts the mesa, a current flows from the mesa to the burying layers, and the current to the active layer 14 cannot be narrowed.

The growth of the p-type InP burying layer 17a on the side of the mesa is much influenced by the surface state and the shape of the side of the mesa, which becomes the burying boundary. The portion exposed on the surface may be oxidized depending on the methods or conditions of etching for forming the mesa, or the semiconductor materials composing the mesa. On such an oxide layer, since the p-type InP burying layer 17a is difficult to form epitaxially, growing so as to coat such a portion begins after the semiconductor layers below the surface-oxidized semiconductor layer has been completely buried.

Therefore, there has been a problem wherein the n-type InP current blocking layer 18 contacts the mesa, and an invalid current pathway 24 wherein a current flows from the mesa to the burying layers is formed as shown in FIG. 12. Also in the mesa composed of Al-containing semiconductor materials, Al on the side of the mesa is oxidized when exposed to the atmosphere disturbing burying growth, and defective burying such as pitted growth occurs easily. In addition, since oxygen or impurities on the boundary might cause crystalline defects, there has been a problem wherein they become the cause of element deterioration. For these reasons, it is important for the characteristics and reliability of semiconductor lasers to reduce the amount of oxygen on the side of the mesa composed of Al-containing semiconductor materials.

Conventionally, therefore, the oxidation of Al-containing semiconductor layers has been prevented by placing a wafer in the state having a protective layer on the Al-containing semiconductor layer in a burying growth furnace, and, after surface cleaning is performed using HCl gas at a low temperature of not higher than 450° C. to remove oxygen on the surface of the protective layer, elevating the temperature to 450° C. or higher to perform mesa formation and burying growth using HCl gas etching (e.g., refer to Japanese Patent Laid-Open No. 7-263355). However, if the Al-containing semiconductor layer is exposed to the atmosphere and oxidized, it is difficult to remove oxygen only by HCl cleaning at a temperature of 450° C. or lower.

SUMMARY OF THE INVENTION

To solve the above-described problems, it is an object of the present invention to provide a method for manufacturing a semiconductor laser element that can prevent the formation of an invalid current pathway wherein a current flows from the mesa to burying layers.

According to one aspect of the present invention, a method for manufacturing a semiconductor laser element according to the present invention has a step for forming a semiconductor laminated structure having an active layer on a substrate; a step for etching the semiconductor laminated structure to form a mesa; a first cleaning step for cleaning the side of the mesa using a gas having an etching effect at a temperature lower than the critical temperature at which the oxide layer on the side of the mesa is firmed; a second cleaning step for cleaning the side of the mesa using a gas having an etching effect at a temperature higher than the critical temperature after the first cleaning step; and a step for forming a burying layer so as to coat the side of the mesa after cleaning the side of the mesa.

According to the present invention, the formation of an invalid current pathway wherein current flows from the mesa to the burying layer can be prevented. Also, since the content of impurities in the boundary between the mesa and the burying layer can be lowered, the improvement of characteristics and reliability can be expected.

Other and further objects, features and advantages of the invention will appear more fully from the following description.

DETAILED DESCRIPTION OF THE PREFERRED EMBODIMENTS

First Embodiment

Figure 1:
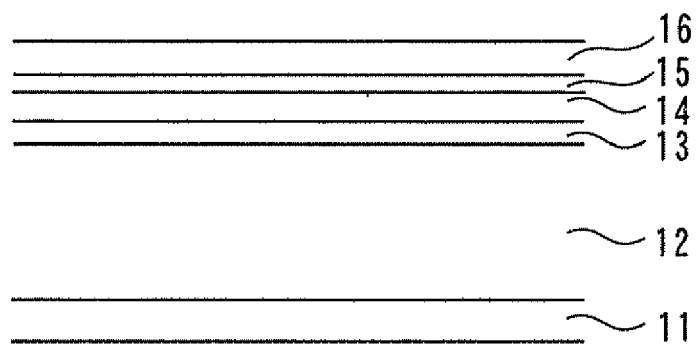
FIGS. 1-5 are sectional views for explaining a method for manufacturing a semiconductor laser element according to First Embodiment of the present invention.

The method for manufacturing a semiconductor laser element according to the first embodiment of the present invention will be described below referring to the drawings.

First, as FIG. 1 shows, a p-type InP clad layer 12, an AlGaInAs lower optical confinement layer 13, an AlGaInAs-MQW active layer 14, an n-type AlGaInAs upper optical confinement layer 15, and an n-type InP clad layer 16 are sequentially grown on a p-type InP substrate 11 using metal organic vapor phase epitaxy (MOVPE) to form a semiconductor laminated structure having an active layer composed of an Al-containing semiconductor material, $Al_xGa_yIn_{1-x-y}As$ (0<x<1, 0<y<1).

Figure 3:
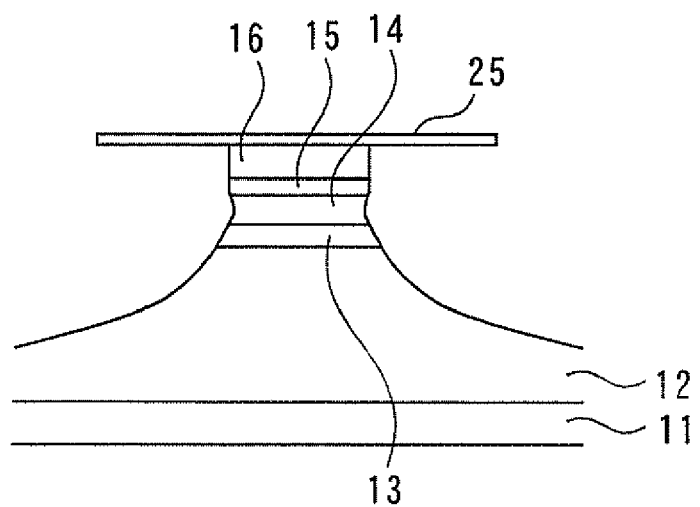

Next, the wafer is taken out from the MOVPE apparatus, an $SiO_2$ film is formed on the wafer to fabricate an $SiO_2$ mask 25 using photo engraving and transfer processes. Then, wet etching is performed using the $SiO_2$ mask 25 as a mask to form a mesa of the semiconductor laminated structure as shown in FIG. 3.

Next, the wafer on which the mesa has been formed is placed in the MOVPE apparatus again, and the mesa is buried. However, the side of the mesa is oxidized during wet etching and wafer transporting. Therefore HCl gas is introduced into the apparatus before burying growth to clean the surface. Specifically, after cleaning the side of the mesa using HCl gas at a first surface cleaning temperature of Tcl_1 (first cleaning step), the side of the mesa is cleaned using HCl gas at a second surface cleaning temperature of Tcl_2 (second cleaning step).

Figure 4:
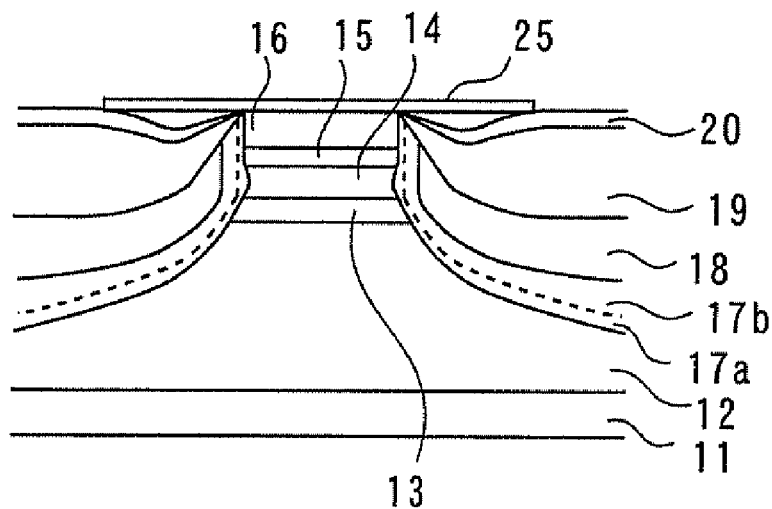

Thereafter, as FIG. 4 shows, a p-type InP first burying layer 17a (burying layer) is formed at a growing temperature Tg_p1 so as to coat the side of the mesa, and a p-type InP second burying layer 17b, an n-type InP current blocking layer 18, a p-type InP burying layer 19, and an n-type InP burying layer 20 (burying layers) are formed at a growing temperature Tg_p2 on the p-type InP first burying layer 17a to bury the circumference of the mesa.

Figure 5:
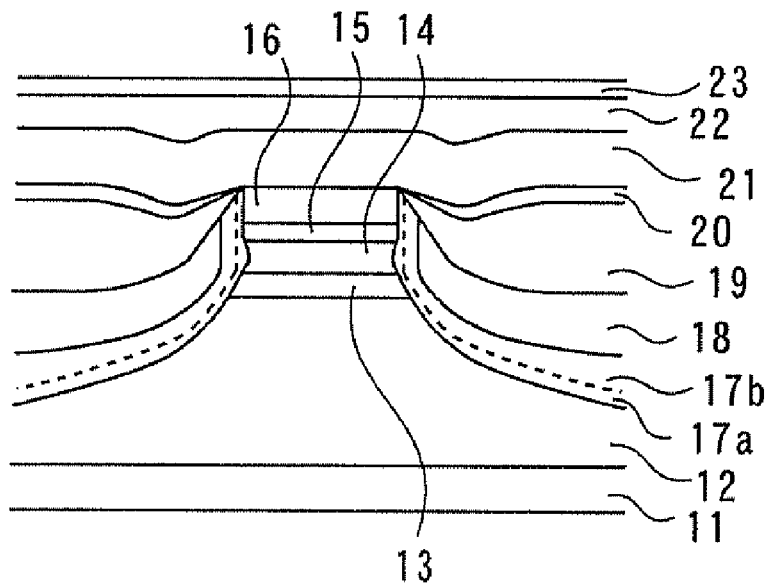

Next, as FIG. 5 shows, the wafer is taken out from the MOVPE apparatus, and the mask 25 is etched off. Thereafter the wafer is placed again in the MOVPE apparatus, and an n-type InP contact layer 21, an n-type InGaAs contact layer 22, and an n-type InP cap layer 23 are formed. By the above-described manufacturing process, a semiconductor laser element having an n/p/n/p buried structure is manufactured.

Figure 6:
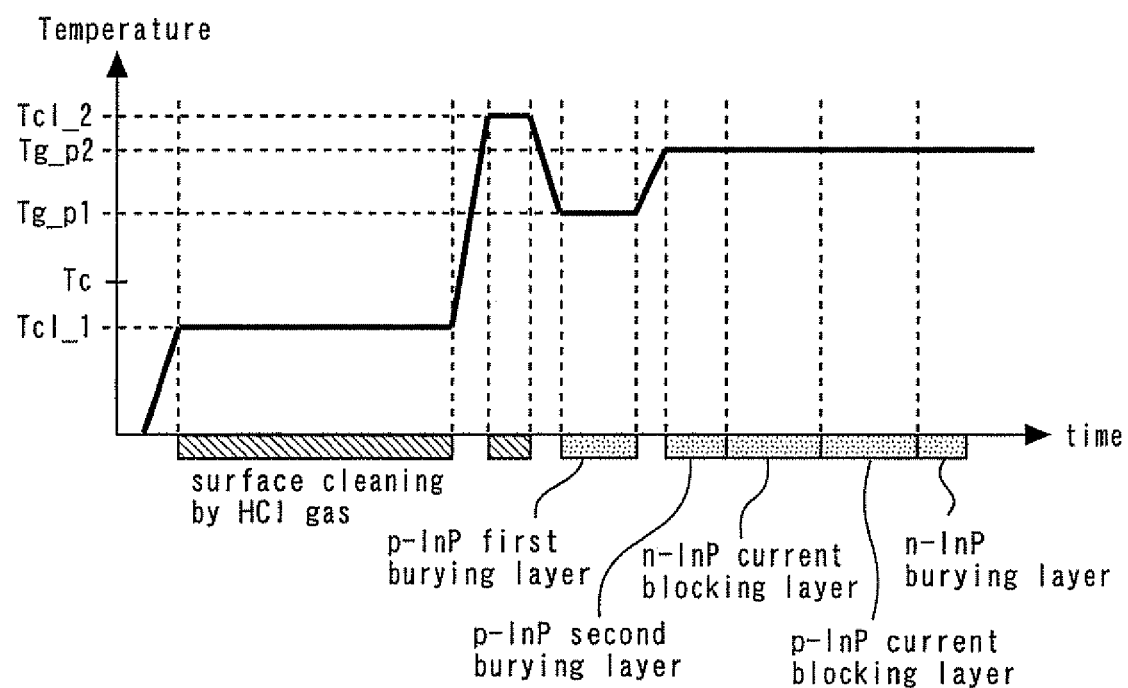
FIG. 6 is a diagram schematically showing the growing temperature and the transition of time for the growth of each layer in burying and growing in the first embodiment.

Here, FIG. 6 is a diagram schematically showing the growing temperature and the transition of time for the growth of each layer in burying and growing in the first embodiment. As FIG. 6 shows, the first surface cleaning temperature Tcl_p1 is lower than Tc, and the second surface cleaning temperature Tcl_p2 is higher than Tc. Tc is the critical temperature at which the oxide layer on the side of the mesa is firmed. It is considered that the linkage with O is broken by cleaning at a temperature lower than Tc, and the vapor pressures of remaining Cl compounds or O compounds by thereafter cleaning at a temperature higher than Tc are elevated to enhance the effect for removing the oxide layer.

Figure 7:
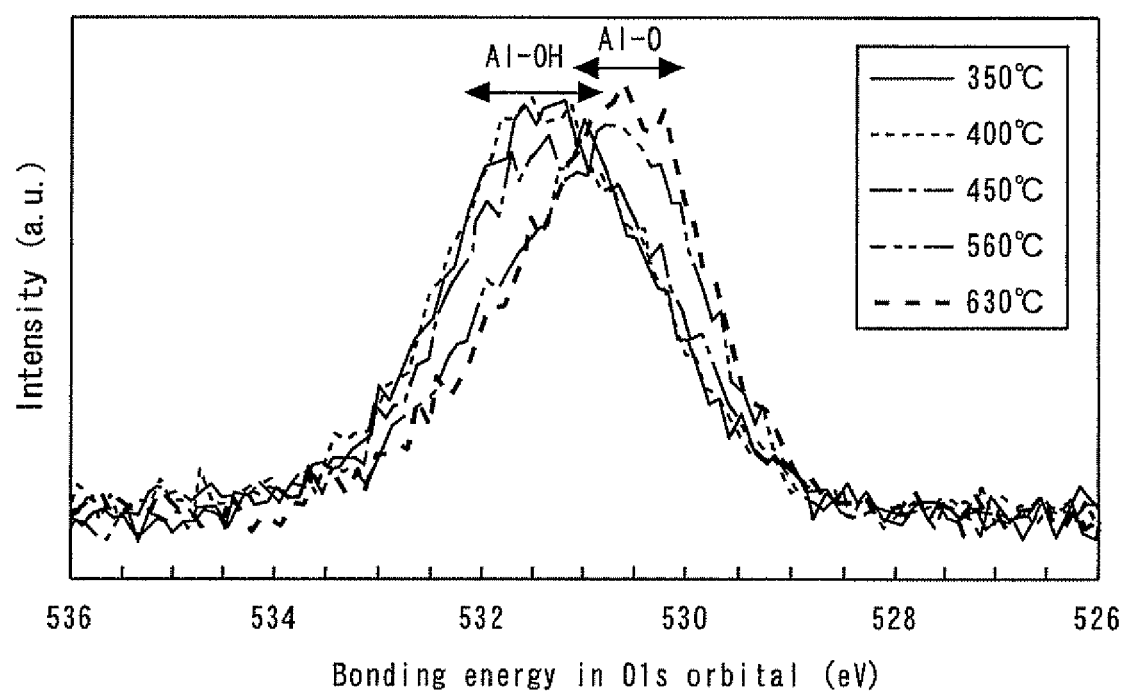
FIG. 7 is a graph showing the results of an XPS analysis that shows change in the bonding state of O and Al when AlInAs was heated to each temperature.

FIG. 7 is a graph showing the results of an XPS analysis that shows change in the bonding state of O and Al when AlInAs was heated to each temperature. O is bonded to Al to create firmer bonding as a hydroxyl group at a temperature lower than 450° C., and as O alone at a temperature higher than 560° C. From these results, it is known that the above-described Tc is about 450° C. Therefore, the present invention is characterized in that the cleaning of the surface of an oxidized Al-containing semiconductor is performed at both a temperature lower than 450° C. and a temperature higher than 450° C.

Since the orientation of the crystal face exposed on the side of the mesa is not the (100) face, and the atomic arrangement on the outermost surface and the strength of bonding with oxygen is different from those of the (100) face, it is considered that the oxygen removing effect is different compared with the surface cleaning of the (100) face. Whereas, the oxide on the side of the mesa can be effectively decreased by the above-described cleaning, and the side of the mesa can be coated with the p-type InP first burying layer 17a. Thereby, since the n-type InP current blocking layer 18 can be grown without contacting the mesa, the formation of the invalid current pathway wherein a current flows from the mesa to the burying layer can be prevented. Also, since the content of impurities in the boundary between the mesa and the burying layer can be lowered, the improvement of characteristics and reliability can be expected.

In the first embodiment, although surface cleaning at Tc or higher is once performed after surface cleaning at Tc or lower, surface cleaning can be performed at three or more different temperatures. When the temperature is changed, although the supply of HCl gas is interrupted, the temperature can be changed without interrupting the supply of the gas. Also in the first embodiment, although the p-type InP burying layer is divided into a p-type InP burying layer 17a and a p-type InP burying layer 17b grown at a higher temperature, the growing temperature can be constant.

The present invention is not limited to the n/p/n/p-type burying growth, but can be applied to any burying growth. The present invention can also be applied to the burying growth of a mesa in a semiconductor laminated structure composed of any semiconductor materials, such as InP, AlGaInAs, InGaAs, InGaAsP, AlInAs, AlGaAs, GaAs, AlGaInP, InGaP, AlGaN, GaN, and InGaN. However, if the material differs, since the temperature Tc at which bonding with O is firmed is different and the Cl compounds or O compounds remaining on the surface are different, optimum cleaning temperature must be selected depending on the semiconductor material composing the element.

Although HCl gas is used in the first embodiment, other gases having the etching effect, such as TBCl and $CCl_4$, can be used in the cleaning before burying growth. The present invention can be applied not only to the fabrication of a semiconductor laser, but also to the fabrication of any semiconductor elements, such as a modulator and a light receiving element.

Second Embodiment

A method for manufacturing a semiconductor laser element according to the second embodiment of the present invention will be described referring to the drawings.

Figure 2:
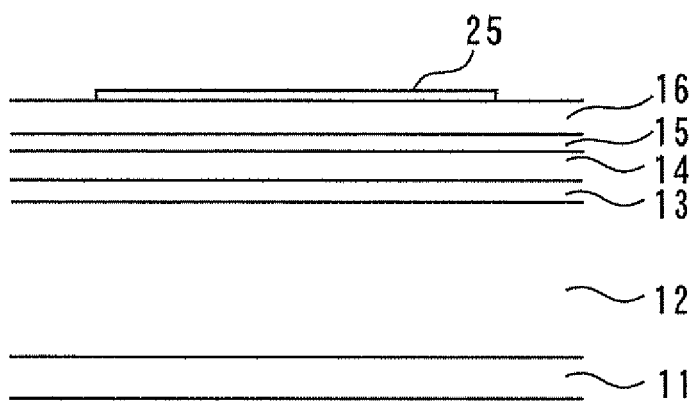
Figure 8:
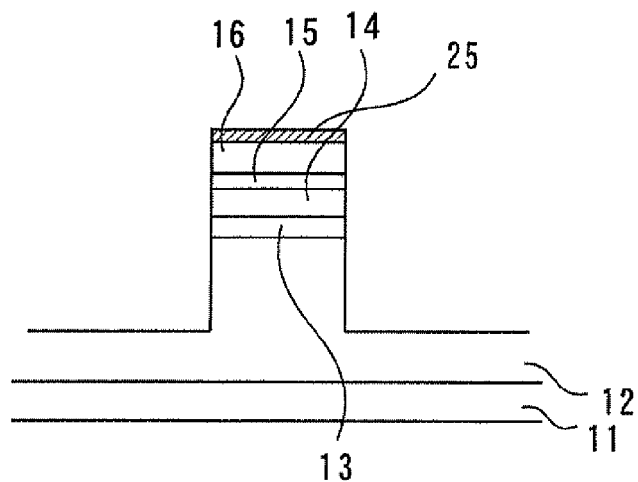
FIGS. 8-10 are sectional views for explaining a method for manufacturing a semiconductor laser element according to Second Embodiment of the present invention.

First, as in the first embodiment, and as FIG. 1 shows, a semiconductor laminated structure composed of InP, AlGaInAs, and AlInAs is formed on a p-type InP substrate 11; and as FIG. 2 shows, an $SiO_2$ mask 25 is fabricated. Dry etching is performed using the $SiO_2$ mask 25 as a mask to form a mesa of a semiconductor laminated structure as FIG. 8 shows. Specifically, since the mesa is formed by dry etching, the orientation of the crystal face of the exposed mesa is different from that of the first embodiment. The shape of the mesa in FIG. 8 has a vertically sheer drop against the substrate; however, the following is the same when the cross-section of the mesa is trapezoidal.

Next, the wafer on which the mesa has been formed is placed in the MOVPE apparatus again, and the mesa is buried. However, the side of the mesa is oxidized during wet etching and wafer transporting. Therefore, as in the first embodiment, HCl gas is introduced into the apparatus before burying growth to clean the surface. Specifically, after cleaning the side of the mesa using HCl gas at a first surface cleaning temperature of Tcl_1 (first cleaning step), the side of the mesa is cleaned using HCl gas at a second surface cleaning temperature of Tcl_2 (second cleaning step).

Figure 9:
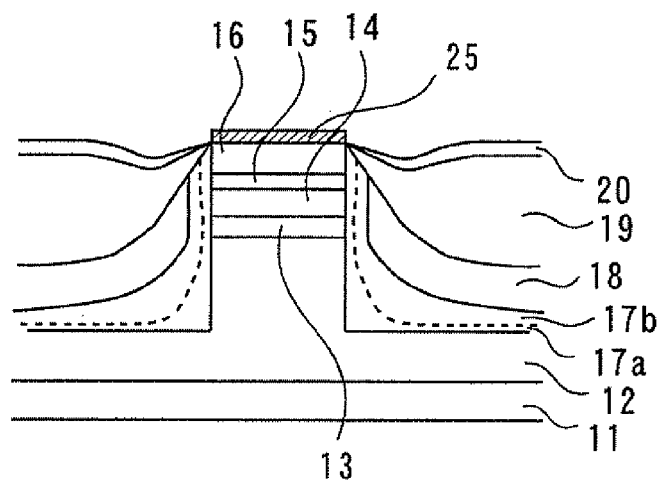

Thereafter, as FIG. 9 shows, a p-type InP first burying layer 17a (burying layer) is formed at a growing temperature Tg_p1 so as to coat the side of the mesa, and a p-type InP second burying layer 17b, an n-type InP current blocking layer 18, a p-type InP burying layer 19, and an n-type InP burying layer 20 (burying layers) are formed at a growing temperature Tg_p2 on the p-type InP first burying layer 17a to bury the circumference of the mesa.

Figure 10:
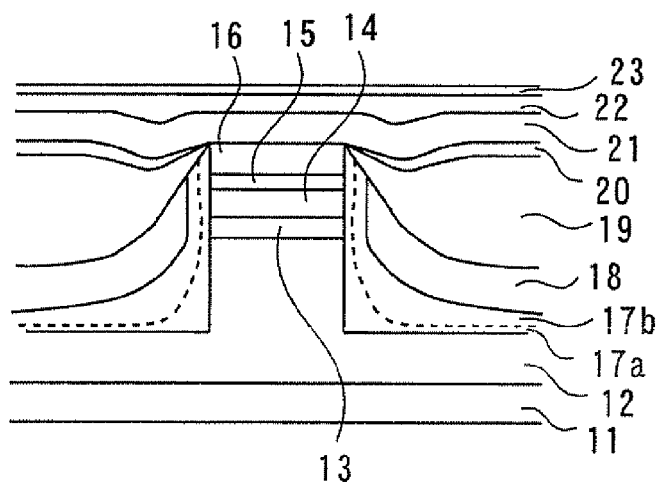
Figure 11:
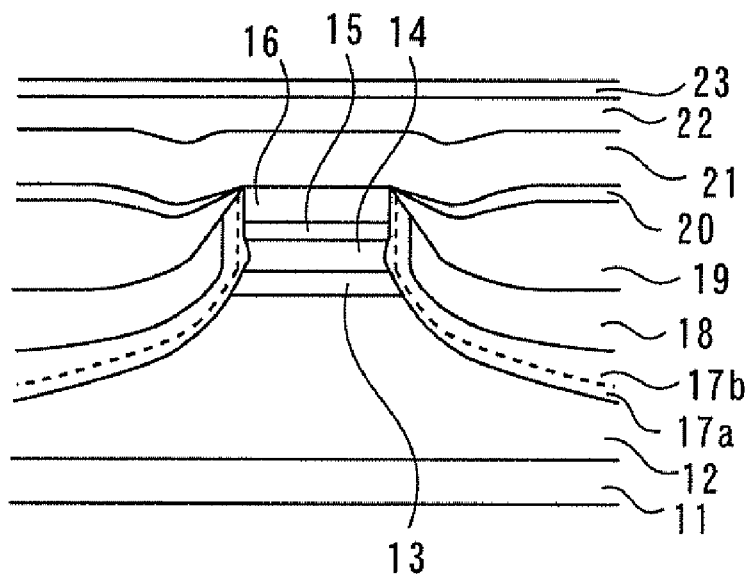
FIG. 11 is a sectional view showing a semiconductor laser element wherein the circumference of the mesa in a semiconductor laminated structure having an active layer is buried with n/p/n/p-type semiconductor layers.
Figure 12:
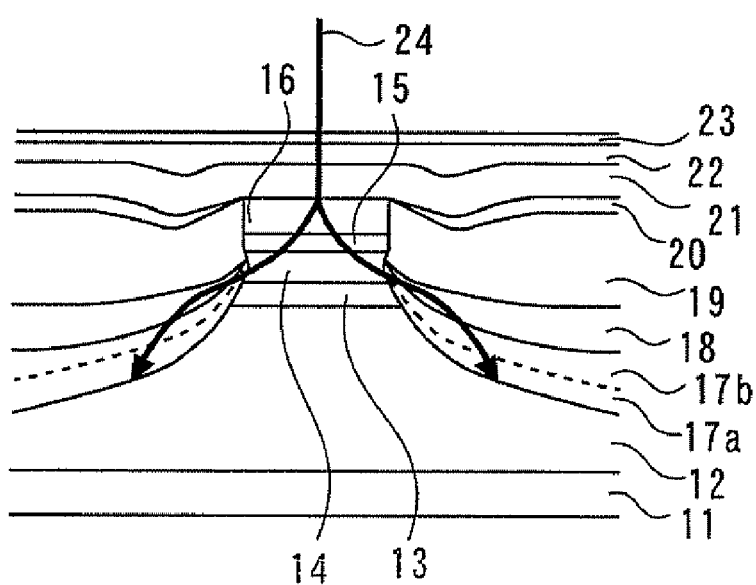
FIG. 12 is a sectional view showing a semiconductor laser element wherein an invalid current pathway wherein a current flows from the mesa to the burying layers is formed.

Next, as FIG. 10 shows, the wafer is taken out from the MOVPE apparatus, and the mask 25 is etched off. Thereafter, the wafer is placed again in the MOVPE apparatus, and an n-type InP contact layer 21, an n-type InGaAs contact layer 22, and an n-type InP cap layer 23 are formed. By the above-described manufacturing process, a semiconductor laser element having an n/p/n/p buried structure is manufactured.

Even for the mesa having a different orientation of the crystal face exposed to the side by forming using dry etching, by cleaning in the same manner as in the first embodiment, the same effect as in the first embodiment can be obtained. The scope of the application of the second embodiment is the same as in the first embodiment.

Obviously many modifications and variations of the present invention are possible in the light of the above teachings. It is therefore to be understood that within the scope of the appended claims the invention maybe practiced otherwise than as specifically described.

The entire disclosure of a Japanese Patent Application No. 2006-230856, filed on Aug. 28, 2006 including specification, claims, drawings and summary, on which the Convention priority of the present application is based, are incorporated herein by reference in its entirety.

What is claimed is:

1. A method for manufacturing a semiconductor laser element comprising:
    forming a semiconductor laminated structure, having an active layer, on a substrate;
    etching said semiconductor laminated structure to form a mesa having side surfaces;
    exposing the side surfaces of the mesa to an oxygen-containing ambient, whereby an oxide layer is formed on the side surfaces of the mesa;
    removing a first part of the oxide layer from the side surfaces of the mesa at a temperature lower than a critical temperature at which bonds between atoms of the oxide layer become stronger, by etching with a gas;
    thereafter, removing a second, remaining part of the oxide layer from the side surfaces of the mesa at a temperature higher than the critical temperature, by etching with a gas; and
    forming a burying layer coating the side surfaces of the mesa after removing the oxide layer from the side surfaces of the mesa.

2. A method for manufacturing a semiconductor laser element comprising:
    forming a semiconductor laminated structure, having an active layer including an Al-containing semiconductor material, on a substrate;
    etching said semiconductor laminated structure to form a mesa having side surfaces;
    exposing the side surfaces of the mesa to an oxygen-containing ambient, whereby an oxide layer is formed on the side surfaces of the mesa, including on the Al-containing semiconductor material exposed at the side surfaces of the mesa;
    removing a first part of the oxide layer from the side surfaces of the mesa at a temperature lower than 450° C. by etching with a gas;
    thereafter, removing a second, remaining part of the oxide layer from the side surfaces of the mesa at a temperature higher than 450° C. by etching with a gas; and
    forming a burying layer coating the side surfaces of the mesa after removing the oxide layer from the side surfaces of the mesa.

* * * * *